US005984255A

United States Patent [19]

Reyes

[11] Patent Number: 5,984,255

[45] Date of Patent: Nov. 16, 1999

[54] METHOD OF USING SUPPORT TRAY FOR PRODUCT ASSEMBLY

[76] Inventor: Theodore R. Reyes, 2404 Bear Rock Glen, Escondido, Calif. 92026

[21] Appl. No.: 08/976,868

[22] Filed: Nov. 24, 1997

[51] Int. Cl.[6] .......... F16M 5/00

[52] U.S. Cl. .......... 248/694

[58] Field of Search .......... 248/346.5, 346.02, 248/694; 108/55.1, 55.3, 55.5, 56.1; 226/600, 724, 701; 361/600, 679

[56] References Cited

U.S. PATENT DOCUMENTS

| | | | |
|---|---|---|---|
| 357,689 | 2/1887 | Porrera | 248/346.5 |
| 3,636,888 | 1/1972 | Angelbeck, Jr. | 108/55.3 X |
| 4,226,192 | 10/1980 | Myers | 108/55.3 X |
| 5,250,851 | 10/1993 | McKnight et al. | 248/346.5 X |
| 5,722,328 | 3/1998 | Darby | 108/55.1 |
| 5,775,510 | 7/1998 | Hodges | 206/724 |

*Primary Examiner*—Ramon O. Ramirez
*Attorney, Agent, or Firm*—Russell B. Miller; Christopher Edwards; Byron Yafuso

[57] ABSTRACT

A pallet tray for supporting a CCA chassis during assembly and transportation has a generally flat base with opposite first and second ends, and first and second end rails secured adjacent the first and second ends, respectively, so as to project upwardly from the base. Each end rail has an upper, generally flat support surface spaced a predetermined distance above the base, the support surface having an outer edge adjacent the respective end of the base, and a lip projecting upwardly from the outer edge of the support surface.

5 Claims, 1 Drawing Sheet

18 12 18 20 20 16 24 16 14

METHOD OF USING SUPPORT TRAY FOR PRODUCT ASSEMBLY

BACKGROUND OF THE INVENTION

The present invention relates to a support device or tray for supporting a product such as a CCA (circuit card assembly) shelf or chassis both during assembly and during transportation to a card cage or rack in which a plurality of CCA shelves are stacked.

When electronic devices such as CCA shelves are assembled, the individual components are light, but the assembled CCA chassis or shelf, carrying various electronic components and cables, is relatively heavy. The assembled chassis or shelf must be moved from an assembly station to a conveyor for transportation to another station, where it is removed from the conveyor and placed into a cage or rack. This is normally done manually. If the chassis or shelf is placed on a flat pallet or tray, it is difficult to lift off for placement onto a rack.

SUMMARY OF THE INVENTION

It is an object of the present invention to provide a new and improved support tray for use during assembly and transportation of electronic devices such as CCA chassis or shelves for stacking in a CCA rack.

According to the present invention, a support tray is provided which comprises a base of conductive material having an upper surface and opposite ends, and first and second end supports of conductive material projecting upwardly from the upper surface adjacent the opposite ends of the base, each end support having an upper, flat face, and an outer longitudinal edge extending parallel to the respective end of the base, and each end support having a lip extending along the outer longitudinal edge and projecting upwardly from the upper face of the end support.

Preferably, the base and end supports are each of the same conductive material such as conductive polystyrene or plastic material, and are suitably adhered together. During assembly of an electronic device such as a CCA chassis or box at a work station, the support tray is placed on the work surface and the chassis or box is placed onto the end supports during assembly, so that it is spaced above the base of the support tray. After assembly, the assembled CCA chassis and tray are both placed onto a roller conveyor for transportation to the rack. On arrival at the rack, fork-lift type handling equipment can readily lift the CCA chassis from the tray by engaging beneath the chassis in the gap between the chassis and tray. The conductive material used for the tray ensures that no static electricity is generated either at the work station or during movement over the roller conveyor.

In a preferred embodiment of the invention, the base has a recessed upper surface with an upwardly projecting peripheral rim, for added rigidity and strength. This resists warping of the base, ensuring that the lower surface remains flat for rolling across roller conveyors without hanging up. The recessed base also permits assemblers to lay assorted hardware in the tray.

The support tray therefore allows a CCA chassis to be assembled directly on tray on which it is to be transported, and also allows the chassis to be readily lifted from the tray for insertion into a rack using a fork-lift type device, without having to be manually lifted from the tray.

BRIEF DESCRIPTION OF THE DRAWINGS

The present invention will be better understood from the following detailed description of a preferred embodiment of the invention, taken in conjunction with the accompanying drawings, in which like reference numerals refer to like parts, and in which.

DESCRIPTION OF THE PREFERRED EMBODIMENT

Figure 1:
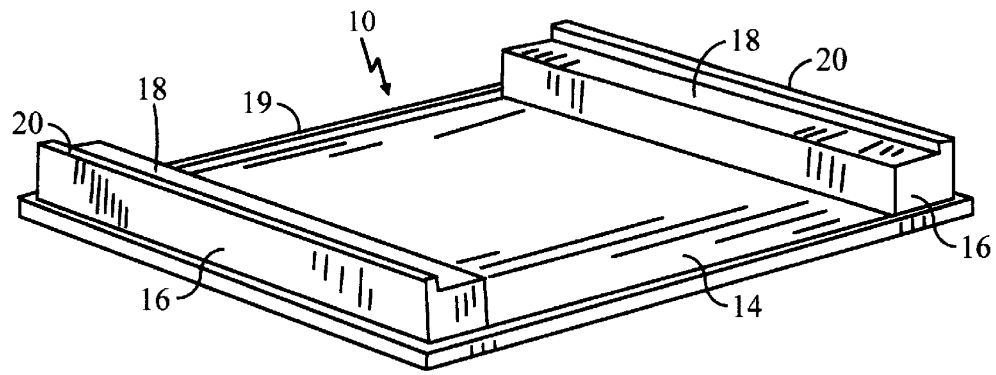
FIG. 1 is a perspective view of a support tray according to a preferred embodiment of the invention.

The drawings illustrate a product support tray 10 for supporting products such as a CCA chassis or shelf 12 during both assembly and transportation. The tray 10 is formed of a rigid, high impact conductive material and comprises a base 14 and a pair of end rails or supports 16 projecting upwardly at opposite ends of the base. Each end rail 16 has a flat upper support surface 18 and an upwardly projecting lip or rim 20 extending along its outer longitudinal edge. The end rails 16 are of the same height so that the upper support surfaces 18 are aligned in the same horizontal plane.

The base is preferably vacuum formed with an upwardly projecting peripheral rim or side wall 19, so that the upper surface of the base is recessed. The lower surface of the base is flat.

Figure 2:
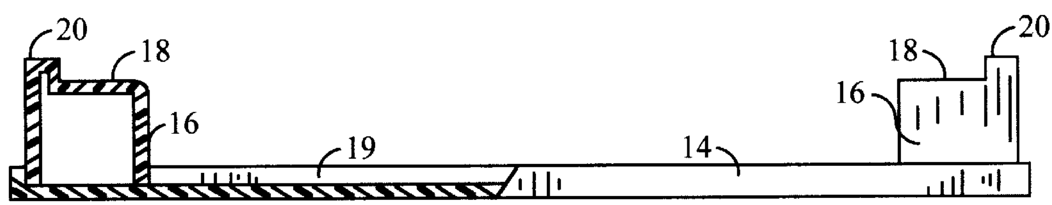
FIG. 2 is an enlarged side view, partially in section.

The base 14 and each of the end rails 16 are each preferably vacuum formed in one piece, as illustrated in FIG. 2, and the end rails are then suitably adhered to the opposite ends of the base. The material of the base and end rails is preferably a rigid, high impact, conductive polystyrene.

Figure 3:
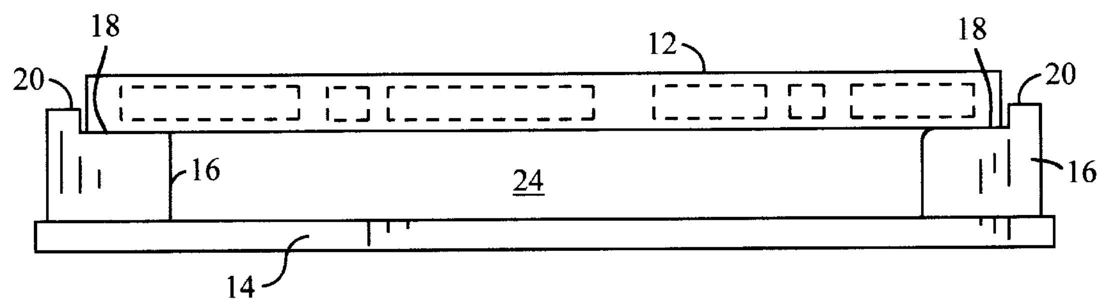
FIG. 3 is a side view showing a product mounted on the tray.

The dimensions of the tray 10 will be dependent on the dimensions of a product, such as a CCA chassis, to be assembled on the tray. The spacing between the end rails is less than the overall length of the product or chassis 12 to be supported, so that opposite end portions of the chassis 12 may be seated on each of the support surfaces 18, as best illustrated in FIG. 3. The distance between the opposite end lips 20 on the end rails will be slightly greater than the overall length of the product or chassis 12 to be supported. In one specific example of a tray for assembly and transport of a CCA chassis, the tray had a length of 26.25" and a width of 22.25". Each end rail had a height of 2.5" and a width of around 3.0". Each lip had a height of around 0.5" and a width of about 0.75". The base and end rails were each formed of ⅛" polystyrene conductive material. Each support surface 18 is preferably spaced at least 2" above the base, and is preferably at a height of approximately 2.25" above the base.

The tray 10 will be placed on a support surface at a work station so that a product such as a CCA chassis or shelf may be assembled directly on the tray. A CCA chassis may be a sheet metal container, box or panel into which various components and cables are assembled. The individual parts making up the circuit card assembly are relatively light, but the weight increases during assembly as more components are added. It is therefore advantageous to assemble the chassis directly onto the support tray on which it will be transported. As illustrated in FIG. 3, the chassis is supported at its opposite ends with the central portion raised above the base to leave a gap 24. Assemblers may place assorted hardware in the recessed, tray-like base 14.

Once the CCA chassis is assembled, it must be transported, generally via a roller conveyor, to a rack on which the chassis or shelf is stacked. The lips 20 will prevent the part or chassis 12 from sliding off the tray during transportation. The peripheral rim 19 of the base 14 adds strength and rigidity, resisting bending and allowing the tray to roll smoothly over a roller conveyor without hanging up. On arrival at the rack, a fork-lift type of handling device is used to engage the chassis via gap 24, lift the chassis from the tray, and transport the chassis into a rack. Thus, the height of gap 24 is selected based on the dimensions of the fork lift device to be used to lift the chassis from the tray.

The support or pallet tray of this invention allows a product to be assembled readily directly onto the tray, after which it can be transported on the same tray to the desired location. On arrival, the product can be readily lifted from the tray at its center, due to the gap between the product and base of the tray.

Although a preferred embodiment of the invention has been described above by way of example only, it will be understood by those skilled in the field that modifications may be made to the disclosed embodiment without departing from the scope of the invention, which is defined by the appended claims.

I claim:

1. A method of assembling a circuit card subassembly, comprising the steps of:

positioning opposite end portions of a CCA chassis on a pair of spaced end rails on a tray at a work station so that the chassis is spaced a predetermined distance above the tray to form a gap between the chassis and the tray;

assembling predetermined circuit components onto the chassis;

transporting the assembled chassis on the tray from the work station to a rack; and lifting the assembled chassis from the tray with a fork lift device engaging the chassis through the gap between the chassis and tray.

2. A method as in claim 1 further including the steps of:

providing first and second end rails adjacent to the opposite ends of the rail;

securing said first and second end rails, respectively, of the base so as to project upwardly from the base; and providing the base with an upwardly projecting peripheral rim.

3. A method as in claim 2 further including the step of:

forming the base and each end rail in one piece from a conductive material.

4. A method as in claim 3 wherein the conductive material is vacuum formed polystyrene.

5. The method as in claim 4 wherein the polystyrene is about ⅛" thick.

* * * * *